(12) United States Patent
Van De Kerkhof et al.

(10) Patent No.: US 9,798,250 B2
(45) Date of Patent: Oct. 24, 2017

(54) LITHOGRAPHIC APPARATUS FOR MEASURING OVERLAY ERROR AND A DEVICE MANUFACTURING METHOD

(71) Applicant: ASML Netherlands B.V., Veldhoven (NL)

(72) Inventors: Marcus Adrianus Van De Kerkhof, Helmond (NL); Leonardus Henricus Marie Verstappen, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/264,152

(22) Filed: Sep. 13, 2016

(65) Prior Publication Data

US 2016/0377992 A1   Dec. 29, 2016

Related U.S. Application Data

(63) Continuation of application No. 14/867,606, filed on Sep. 28, 2015, now abandoned, which is a continuation of application No. 13/055,594, filed as application No. PCT/EP2009/005422 on Jul. 27, 2009, now Pat. No. 9,201,310.

(60) Provisional application No. 61/090,118, filed on Aug. 13, 2008.

(51) Int. Cl.
*G06K 9/62* (2006.01)
*G03F 7/20* (2006.01)

(52) U.S. Cl.
CPC .......... *G03F 7/70633* (2013.01); *G03F 7/705* (2013.01)

(58) Field of Classification Search
CPC ......... G03F 7/70633; G03F 7/705; G03F 9/70

USPC .................... 716/50–56; 430/5, 30
See application file for complete search history.

(56) References Cited

U.S. PATENT DOCUMENTS

| | | | | |
|---|---|---|---|---|
| 6,721,691 B2 * | 4/2004 | Bao | ...................... | G01N 21/956 356/369 |
| 6,957,119 B2 * | 10/2005 | Peng | ................... | G03F 7/70633 355/27 |
| 7,200,455 B2 * | 4/2007 | Schulze | ........... | G05B 19/41865 382/145 |

(Continued)

FOREIGN PATENT DOCUMENTS

| | | |
|---|---|---|
| EP | 1 628 164 A2 | 2/2006 |
| TW | I246734 B | 1/2006 |

(Continued)

OTHER PUBLICATIONS

International Preliminary Report on Patentability and Written Opinion directed to related International Patent Application No. PCT/EP2009/005422, dated Mar. 3, 2011, International Bureau of WIPO, Geneva, Switzerland; 8 pages.

(Continued)

*Primary Examiner* — Samir Ahmed
(74) *Attorney, Agent, or Firm* — Sterne, Kessler, Goldstein & Fox P.L.L.C.

(57) ABSTRACT

A lithographic apparatus including an inspection apparatus can measure the overlay error of a target in a scribelane is measured. The overlay error of the required feature in the chip area may differ from this due to, for example, different responses to the exposure process. A model is used to simulate these differences and thus a more accurate measurement of the overlay error of the feature determined.

7 Claims, 4 Drawing Sheets

(56) References Cited

U.S. PATENT DOCUMENTS

| | | | | |
|---|---|---|---|---|
| 7,310,789 | B2* | 12/2007 | Seligson | G03F 7/705 716/52 |
| 7,477,396 | B2* | 1/2009 | Smith | G03F 7/70633 356/445 |
| 7,561,282 | B1* | 7/2009 | Widmann | G03F 7/70625 356/401 |
| 7,566,517 | B1* | 7/2009 | Adel | G03F 1/36 430/30 |
| 9,201,310 | B2 | 12/2015 | Van De Kerkhof et al. | |
| 2003/0223630 | A1* | 12/2003 | Adel | G03F 7/705 382/145 |
| 2004/0038455 | A1* | 2/2004 | Seligson | G03F 7/705 438/122 |
| 2004/0040003 | A1* | 2/2004 | Seligson | G03F 7/705 382/151 |
| 2006/0023198 | A1* | 2/2006 | Froehlich | G03F 7/70425 355/77 |
| 2006/0210893 | A1* | 9/2006 | Van Bilsen | G03F 7/70633 430/30 |
| 2006/0280357 | A1* | 12/2006 | Seligson | G03F 7/705 382/144 |
| 2007/0105029 | A1* | 5/2007 | Ausschnitt | B81C 99/0065 430/30 |
| 2008/0170780 | A1* | 7/2008 | Cramer | G03F 7/70625 382/170 |
| 2008/0279442 | A1* | 11/2008 | Den Boef | G03F 1/84 382/144 |
| 2009/0296055 | A1* | 12/2009 | Ye | G03F 7/70266 355/30 |
| 2011/0200246 | A1* | 8/2011 | Van De Kerkhof | G03F 7/70633 382/141 |
| 2016/0018742 | A1 | 1/2016 | Van De Kerkhof et al. | |

FOREIGN PATENT DOCUMENTS

| | | |
|---|---|---|
| TW | I286196 B | 9/2007 |
| TW | I299520 B | 8/2008 |
| WO | WO 2007/040855 A1 | 4/2007 |

OTHER PUBLICATIONS

International Search Report directed to related International Patent Application No. PCT/EP2009/005422, dated Jan. 4, 2010; 2 pages.
English Language Abstract for Taiwanese Patent Pub. No. I299520B, published Aug. 1, 2008; 1 page.
Non-Final Office Action directed to U.S. Appl. No. 13/055,594, dated Jul. 1, 2013; 7 pages.
Final Office Action directed to U.S. Appl. No. 13/055,594, dated Oct. 21, 2013; 8 pages.
Non-Final Office Action directed to U.S. Appl. No. 13/055,594, dated May 30, 2014; 7 pages.
Final Office Action directed to U.S. Appl. No. 13/055,594, dated Sep. 5, 2014; 9 pages.
Notice of Allowance directed to U.S. Appl. No. 13/055,594, dated Jul. 27, 2015; 8 pages.
Non-Final Office Action directed to U.S. Appl. No. 14/867,606, dated Jun. 2, 2016; 8 pages.

* cited by examiner

LITHOGRAPHIC APPARATUS FOR MEASURING OVERLAY ERROR AND A DEVICE MANUFACTURING METHOD

This application incorporates by reference in their entireties U.S. application Ser. No. 14/867,606, U.S. application Ser. No. 13/055,594 and U.S. Provisional Appl. No. 61/090,118.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate, and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate, and measure the spectrum (intensity as a function of wavelength) of the radiation scattered into a particular narrow angular range. Angularly resolved scatterometers use a monochromatic radiation beam and measure the intensity of the scattered radiation as a function of angle.

Measurement of the overlay error is generally achieved by etching specific targets in an unused area of the substrate, known as a scribelane. The overlay error of all the relevant features is then assumed to be the same as the measured overlay error of the target in a nearby scribelane. However, the true overlay error of a particular feature may be affected by a number of different factors, and thus may not be the same as the overlay error of the designated target in the scribelane. In particular, overlay targets may have a different response to changes in illumination mode, polarization and aberrations (static and dynamic) from the feature to measured. Additionally the scribelane may not be very close to the particular feature concerned and thus some interpolation between neighboring targets may be necessary. Furthermore, the process dependencies used of the feature and the target may be different due to different geometry and surrounding structures.

SUMMARY

It is desirable to provide a method which more accurately determines the overlay error of a feature of interest based on measuring overlay from dedicated targets.

According to an embodiment of the invention, there is provided a method of determining overlay error of a feature exposed on a substrate by a lithographic apparatus comprising the following steps. Measuring the overlay error of a target. Determining the overlay error of the feature based on the overlay error of the target and a model of lithographic apparatus metrology.

According to another embodiment of the invention, there is provided a method of determining the overlay error of a feature exposed on a substrate by a lithographic apparatus comprising the following steps. Measuring the overlay error of a target. Determining the overlay error of the feature based on the overlay error of the target and a model, the model modeling the relative overlay error at different positions on the substrate based on inputs from a substrate and/or the lithographic apparatus metrology.

According to a further embodiment of the invention, there is provided a method of determining the overlay error of a feature on a substrate comprising the following steps. Measuring the overlay error of a target. Determining the overlay error of the feature based on the overlay error of the target and a model, the model modeling the characteristics of the feature.

According to a still further embodiment of the invention, there is provided a lithographic apparatus to form a pattern on a substrate that is configured to determine the overlay error using one or more of the methods as described above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1A:
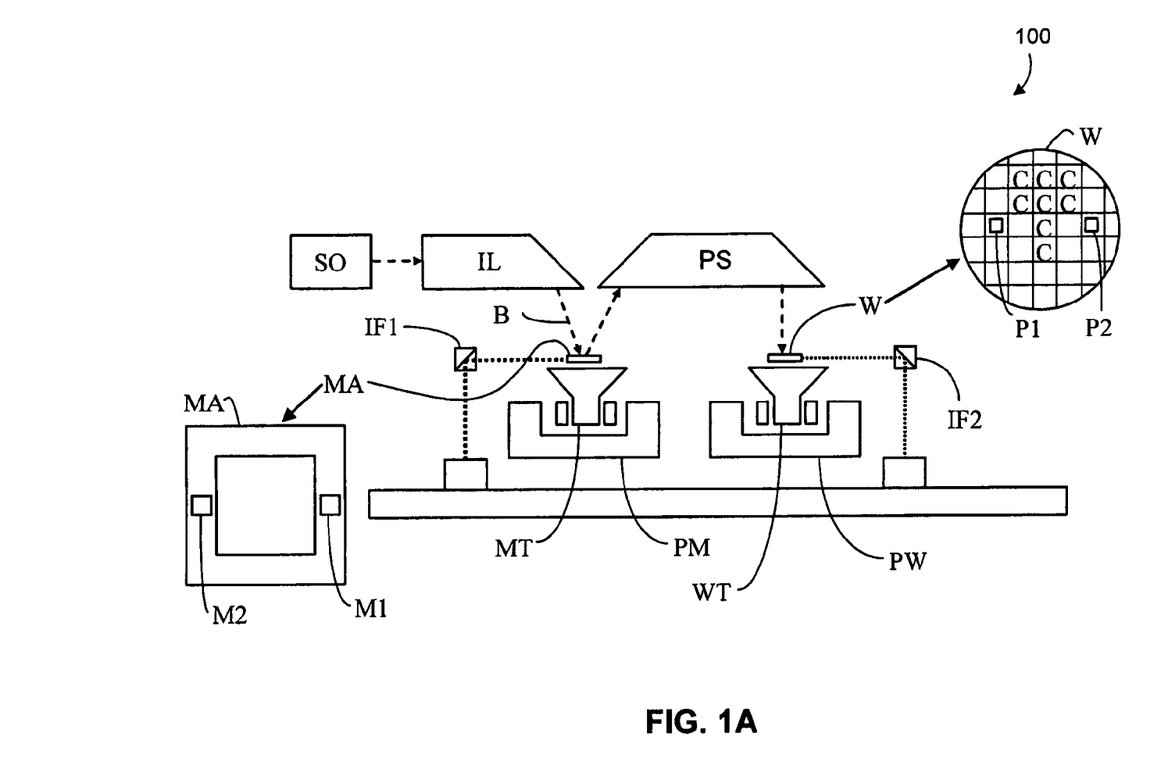
Figure 1B:
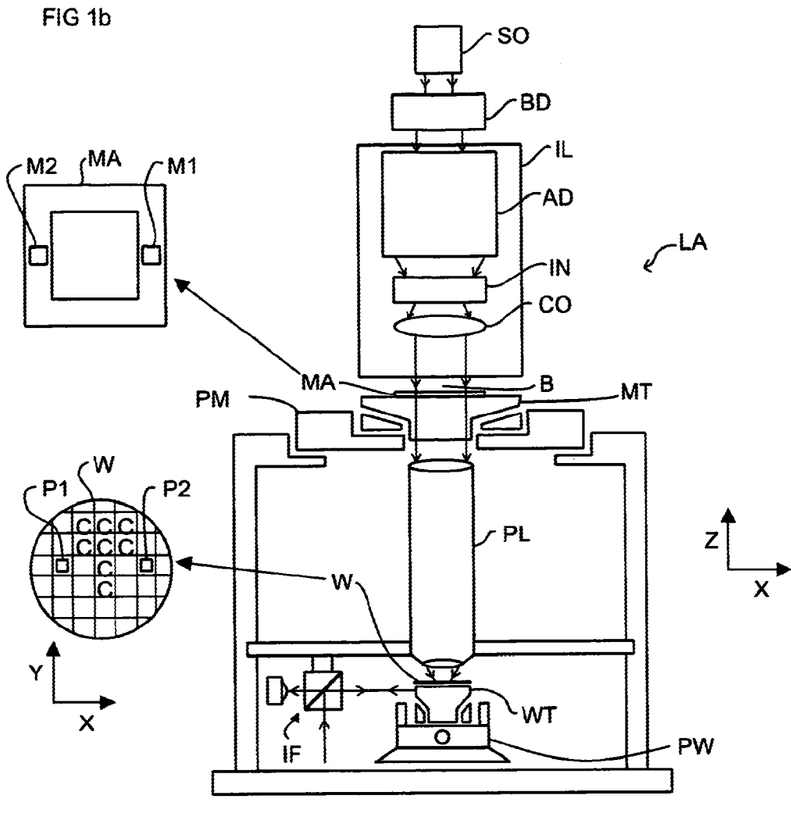

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g., so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Combinations and/or variations on the above described modes of use or entirely different modes of use may also be employed.

Figure 2:
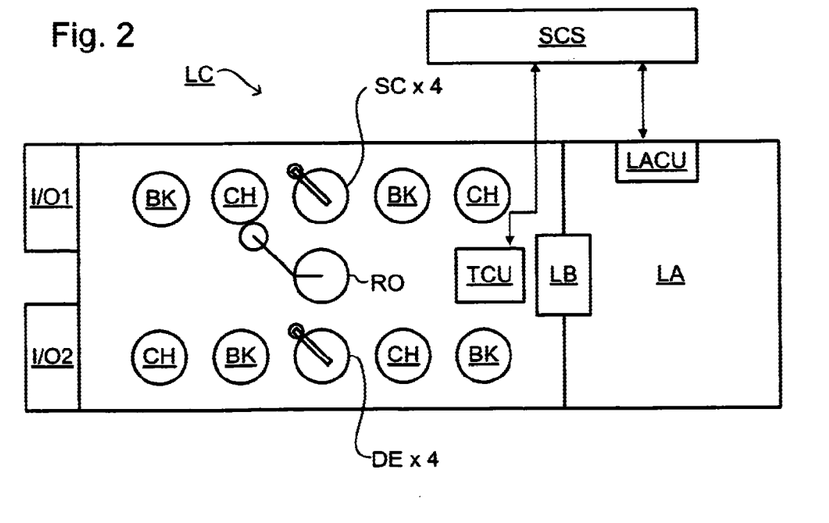
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. IN one example, a lithocell or cluster may include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU, which is itself controlled by the supervisory control system SCS, which also controls the lithographic apparatus via lithography control unit LACU.

Thus, the different apparatus can be operated to maximize throughput and processing efficiency.

In one example, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked, e.g., to improve yield, or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist may have a very low contrast, i.e., there is only a very small difference in refractive index between the parts of the resist which have been exposed to radiation and those which have not, and not all inspection apparatus have sufficient sensitivity to make useful measurements of the latent image. Therefore, measurements may be taken after the post-exposure bake step (PEB), which is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step, such as etching. The latter possibility limits the possibilities for rework of faulty substrates, but may still provide useful information.

Figure 3:
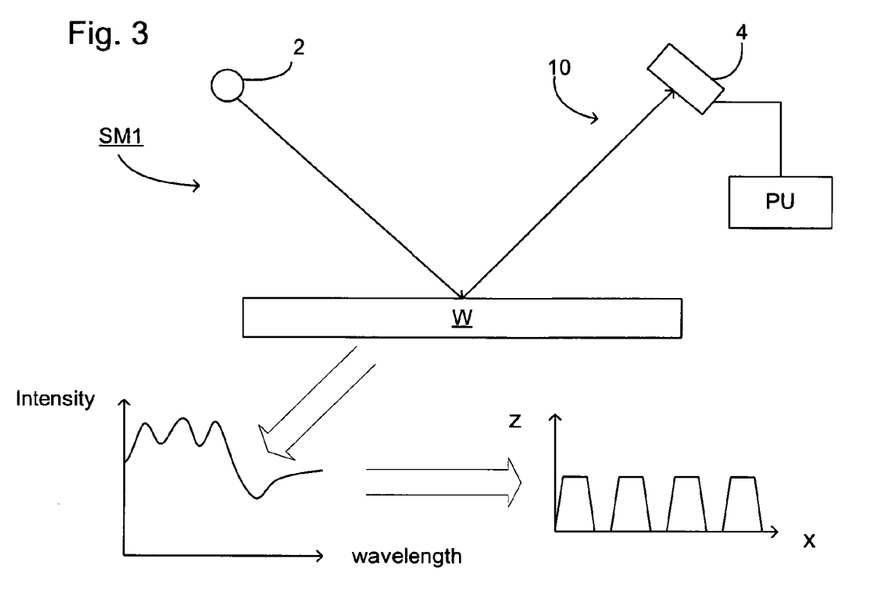
FIG. 3 depicts an exemplary scatterometer.

FIG. 3 depicts a scatterometer SM1 according to an embodiment of the present invention. It comprises a broadband (e.g., white light) radiation projector 2 that projects radiation onto a substrate W. The reflected radiation is passed to a spectrometer detector 4, which measures a spectrum 10 (e.g., intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra, as shown at the bottom of FIG. 3. In one example, for the reconstruction the general form of the structure is known and some parameters are assumed from knowledge of the process by which the structure was made, leaving only a few parameters of the structure to be determined from the scatterometry data. Such a scatterometer may be configured as, for example, a normal-incidence scatterometer or an oblique-incidence scatterometer.

Figure 4:
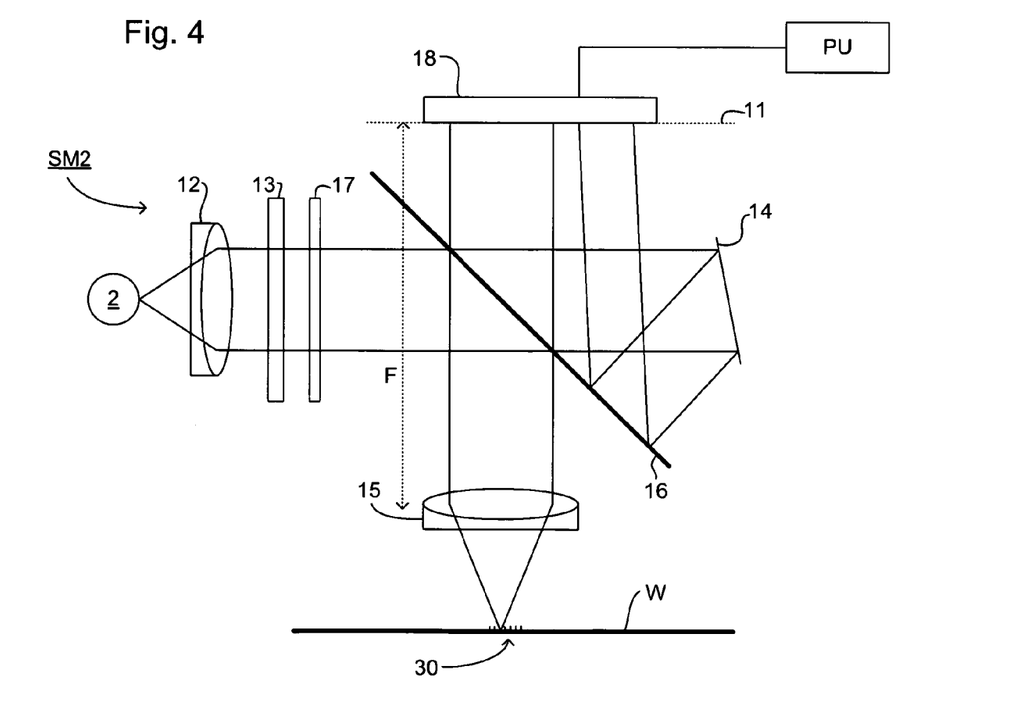
FIG. 4 depicts another exemplary scatterometer.

FIG. 4 shows another scatterometer SM2 according to another embodiment of the present invention. In this device, the radiation emitted by radiation source 2 is focused using lens system 12 through interference filter 13 and polarizer 17, reflected by partially reflected surface 16, and is focused onto substrate W via a microscope objective lens 15, which has a high numerical aperture (NA), for example at least about 0.9 or at least about 0.95. In some examples, immersion scatterometers may even have lenses with numerical apertures over about 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector 18. For example, the pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, about 40 milliseconds per frame.

Additionally, or alternative, a reference beam is often used, for example, to measure the intensity of the incident radiation. To do this, when the radiation beam is incident on the beam splitter 16, part of it is transmitted through the beam splitter as a reference beam towards a reference mirror 14. The reference beam is then projected onto a different part of the same detector 18.

Additionally, or alternatively, a set of interference filters 13 is available to select a wavelength of interest in the range of, for example, about 405-790 nm or even lower, such as about 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

In one example, using a broadband light source (i.e., one with a wide range of light frequencies or wavelengths--and therefore of colors) is possible, which gives a large etendue, allowing the mixing of multiple wavelengths. The plurality of wavelengths in the broadband each has a bandwidth of *8 and a spacing of at least 2*8 (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

In one example, the target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5:
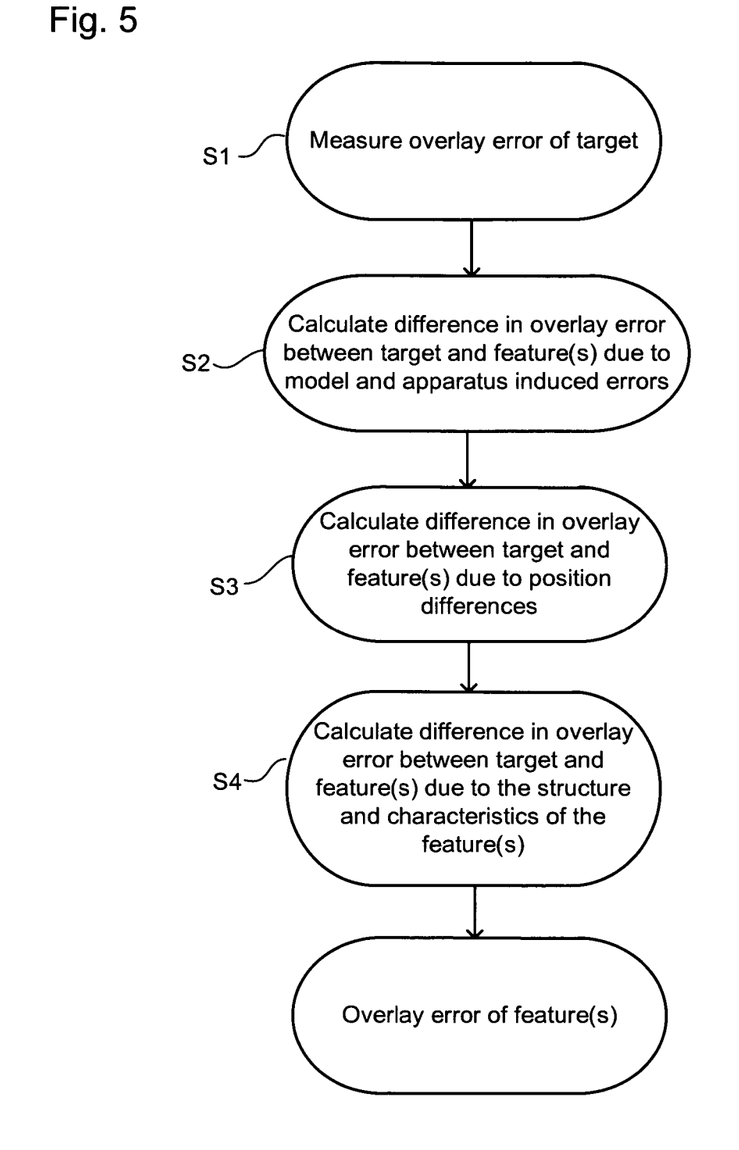
FIG. 5 is a flow chart depicting a method.

FIG. 5 shows a flowchart depicting a method to measure an overlay error. First, an overlay error of a substrate may be measured. From this value, the overlay error of a feature is calculated. However, a number of factors may mean that the overlay error of a feature is not the same as the overlay error of a target.

Firstly, the process of exposing the substrate, including both the feature and the target may itself yield variations in the overlay error between the feature and the target, due to different responses to the illumination mode, polarization and aberrations. This may include, for example, different inputs from the mask MA.

In step S1, an overlay error of a target is measured.

In step S2, a model is used to simulate any relative difference between the overlay error of a feature and the overlay error of the target. In various examples, the model can be generated either by using lithographic apparatus metrology, such as by taking aberration measurements and accounting for the illumination mode and polarization state, or alternatively by using a test substrate to measure the relative differences due to these factors.

Secondly, the different locations of the feature and the target may also yield variations in the overlay error between the feature and the target. In step S3, a model is again used to simulate any relative differences due to the location of the feature and target. Again, in various examples, this model can be generated either by using metrology data from the lithographic apparatus and the mask or by using a test substrate to measure the relative differences due to these factors.

Thirdly, differences between the feature structure and characteristics and the target structure and characteristics could result in different overlay errors due to the processing of the substrate, such as etching, deposition or polishing. These may be assessed using theoretical results, prior experience and/or databases. Alternatively, to assess the different effects, the overlay error for a sample feature can be measured and compared to the overlay error for a target. In step S4, this is then used to model the difference in overlay error calculations between the feature and the target due to product structure and characteristics.

If there are multiple features of interest on a substrate, different models may be used for each feature to account for the different locations and different structures used. Furthermore the overlay error may vary over time and this factor may be included in the model(s).

It is to be appreciated that to ensure the continued accuracy of this method over time, test substrates may be measured at regular and frequent intervals so that the models account for any changes in the apparatus and process over time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength X, of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus comprising:
    an illumination system configured to condition a radiation beam;
    a support structure configured to support a patterning device, the patterning device being configured to pattern the radiation beam;
    a projection system configured to project a patterned radiation beam onto a substrate; and
    an inspection apparatus comprising:
        a detector configured measure a property of radiation reflected by the substrate having a device feature in a chip area and a target; and
        a processing unit operatively coupled to the detector and configured to determine an overlay error of the device feature by:
            determining an overlay error of the target,
            determining a difference between the determined overlay error of the target and the overlay error of the device feature due to a characteristic of the lithographic apparatus,
            determining a difference between the determined overlay error of the target and the overlay error of the device feature due to a difference in position between the target and the device feature on the substrate, and
            determining a difference between the determined overlay error of the target and the overlay error of the device feature due to a characteristic of the device feature.

2. The lithographic apparatus of claim 1, wherein the characteristic of the lithographic apparatus comprises at least one of an aberration, an illumination mode of the lithographic apparatus, and a polarization state of the lithographic apparatus.

3. The lithographic apparatus of claim 1, wherein the target is outside the chip area.

4. The lithographic apparatus of claim 3, wherein the target is in a scribelane.

5. An inspection apparatus for determining an overlay error of a device feature in a chip area of a substrate, the inspection apparatus comprising:
    a detector configured measure a property of radiation reflected by the substrate; and
    a processing unit operatively coupled to the detector and configured to determine an overlay error of the device feature by:
        determining an overlay error of a target on the substrate,
        determining a difference between the determined overlay error of the target and the overlay error of the device feature due to a characteristic of a lithographic apparatus that formed the target and the device feature,
        determining a difference between the determined overlay error of the target and the overlay error of the device feature due to a difference in position between the target and the device feature on the substrate, and
        determining a difference between the determined overlay error of the target and the overlay error of the device feature due to a characteristic of the device feature.

6. The inspection apparatus of claim 5, wherein the characteristic of the lithographic apparatus comprises at least one of an aberration, an illumination mode of the lithographic apparatus, and a polarization state of the lithographic apparatus.

7. The inspection apparatus of claim 5, wherein the target is outside the chip area.

* * * * *

UNITED STATES PATENT AND TRADEMARK OFFICE
CERTIFICATE OF CORRECTION

PATENT NO.        : 9,798,250 B2                    Page 1 of 1
APPLICATION NO.   : 15/264152
DATED             : October 24, 2017
INVENTOR(S)       : Van De Kerkhof et al.

It is certified that error appears in the above-identified patent and that said Letters Patent is hereby corrected as shown below:

On the Title Page

(60) Related U.S. Application Data section, please delete "Aug. 13, 2008" and insert
--Aug. 19, 2008--.

In the Claims

In Column 12, Line 5, please delete "and".

In Column 12, Line 9, after "device feature" please insert --, and
      adjust an exposure parameter of the lithographic apparatus before subsequent processing on
another substrate based on the determined overlay error of the device feature--.

In Column 12, Line 41, after "feature", please insert --wherein the processing unit is further
configured to adjust an exposure parameter of a lithographic apparatus before subsequent processing
on another substrate based on the determined overlay error of the device feature--.

Signed and Sealed this
Twenty-ninth Day of May, 2018

Andrei Iancu
*Director of the United States Patent and Trademark Office*